(12) United States Patent
Bhattacharyya et al.

(10) Patent No.: US 8,912,843 B2
(45) Date of Patent: Dec. 16, 2014

(54) ULTRA LOW CUT-OFF FREQUENCY FILTER

(75) Inventors: Prasun Kali Bhattacharyya, Bangalore (IN); Sumanth Chakkirala, Bangalore (IN); Prakash Easwaran, Bangalore (IN)

(73) Assignee: Cadence AMS Design India Private Limited, Bangalore, Karnataka (IN)

( * ) Notice: Subject to any disclaimer, the term of this patent is extended or adjusted under 35 U.S.C. 154(b) by 0 days.

(21) Appl. No.: 13/009,868

(22) Filed: Jan. 20, 2011

(65) Prior Publication Data
US 2013/0021092 A1    Jan. 24, 2013

(30) Foreign Application Priority Data
Jul. 6, 2010   (IN) .............. 1910/CHE/2010

(51) Int. Cl.
| | |
|---|---|
| H04B 1/10 | (2006.01) |
| H03H 7/01 | (2006.01) |
| H03H 7/06 | (2006.01) |
| H03H 11/12 | (2006.01) |

(52) U.S. Cl.
CPC .............. *H03H 7/0153* (2013.01); *H03H 7/06* (2013.01); *H03H 11/12* (2013.01); *H03H 2210/012* (2013.01); *H03H 2210/028* (2013.01)
USPC .......................................... 327/558; 327/551

(58) Field of Classification Search
USPC .......................................... 327/551–553, 558
See application file for complete search history.

(56) References Cited

U.S. PATENT DOCUMENTS

| | | | | |
|---|---|---|---|---|
| 5,825,238 | A * | 10/1998 | Poimboeuf et al. | 327/552 |
| 5,892,381 | A * | 4/1999 | Koifman et al. | 327/198 |
| 5,999,043 | A * | 12/1999 | Zhang et al. | 327/558 |
| 6,411,531 | B1 * | 6/2002 | Nork et al. | 363/60 |
| 6,657,498 | B2 * | 12/2003 | Park et al. | 330/285 |
| 7,449,942 | B2 * | 11/2008 | Bonaccio et al. | 327/553 |
| 7,477,098 | B2 * | 1/2009 | Dharmalinggam et al. | 327/553 |
| 8,030,992 | B2 * | 10/2011 | Lu et al. | 327/554 |
| 2008/0191759 | A1 * | 8/2008 | Neurauter et al. | 327/157 |
| 2009/0051420 | A1 * | 2/2009 | Bonaccio et al. | 327/553 |

* cited by examiner

*Primary Examiner* — Hai L Nguyen
(74) *Attorney, Agent, or Firm* — Rosenberg, Klein & Lee

(57) ABSTRACT

An ultra low cut-off frequency filter. A filter circuit includes a control circuit responsive to an input signal and a feedback signal to generate a control signal. The filter circuit includes a controllable resistor coupled to the control circuit. The controllable resistor is responsive to a reference signal and the control signal to generate the feedback signal. The filter circuit includes a feedback path coupled to the control circuit and the controllable resistor to couple the feedback signal from the controllable resistor to the control circuit, thereby removing noise from at least one of the input signal and the reference signal, and preventing voltage error in the filter circuit.

11 Claims, 2 Drawing Sheets

ULTRA LOW CUT-OFF FREQUENCY FILTER

TECHNICAL FIELD

Figure 1:
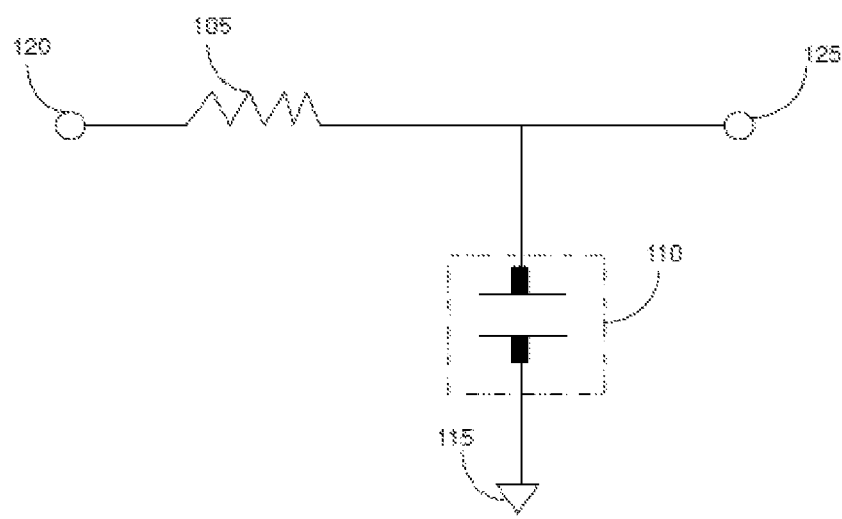

Embodiments of the disclosure relate to an ultra low cut-off frequency filter.

BACKGROUND

A low-pass filter allows signals with frequencies lower than a cut-off frequency and attenuate signals with frequencies higher than the cut-off frequency. Often, removing noise at low frequencies is difficult unless the cut-off frequency of the low-pass filter is extremely low.

The cut-off frequency is inversely proportional to product of resistance value of a resistor and capacitance value of a capacitor of the low-pass filter. It is desired to have a large value of resistance and capacitance for generating a low cut-off frequency. Typically, the resistor is placed inside the integrated circuit and the capacitor is placed outside the integrated circuit. In an existing technique, for having a low cut off frequency, a low-pass filter having a resistor of high resistance value is included in the integrated circuit. In one example, a diode can be used in place of a resistor to provide high resistance value in the low-pass filter. However, having a high resistance value causes voltage drop across the resistor due to leakage current in the integrated circuit.

In light of the foregoing discussion, there is a need for a filter circuit having a low cut-off frequency.

SUMMARY

An example of a filter circuit includes a control circuit responsive to an input signal and a feedback signal to generate a control signal. The filter circuit includes a controllable resistor coupled to the control circuit. The controllable resistor is responsive to a reference signal and the control signal to generate the feedback signal. The filter circuit includes a feedback path coupled to the control circuit and the controllable resistor to couple the feedback signal from the controllable resistor to the control circuit, thereby removing noise from at least one of the input signal and the reference signal, and preventing voltage error in the filter circuit.

An example of a filter circuit includes a control circuit having a first input terminal, a second input terminal, and an output terminal, the first input terminal configured to receive an input signal from an input source, the second input terminal configured to receive a feedback signal, the control circuit operable to generate a control signal at the output terminal. The filter circuit includes a controllable resistor coupled to the control circuit and having a first terminal, a second terminal, and a third terminal, the first terminal configured to receive a reference signal from a reference source, the second terminal configured to receive the control signal from the control circuit, to generate the feedback signal. The filter circuit includes a feedback path coupled to the control circuit and the controllable resistor to couple the feedback signal from the controllable resistor to the control circuit, thereby removing noise from at least one of the input signal and the reference signal and preventing voltage error in the filter circuit. The filter circuit includes a capacitor having a first terminal and a second terminal, the first terminal of the capacitor coupled to the third terminal of the controllable resistor, and the second terminal of the capacitor coupled to one of an electrical ground and a voltage source, to filter one or more frequencies.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the disclosure.

Figure 2:
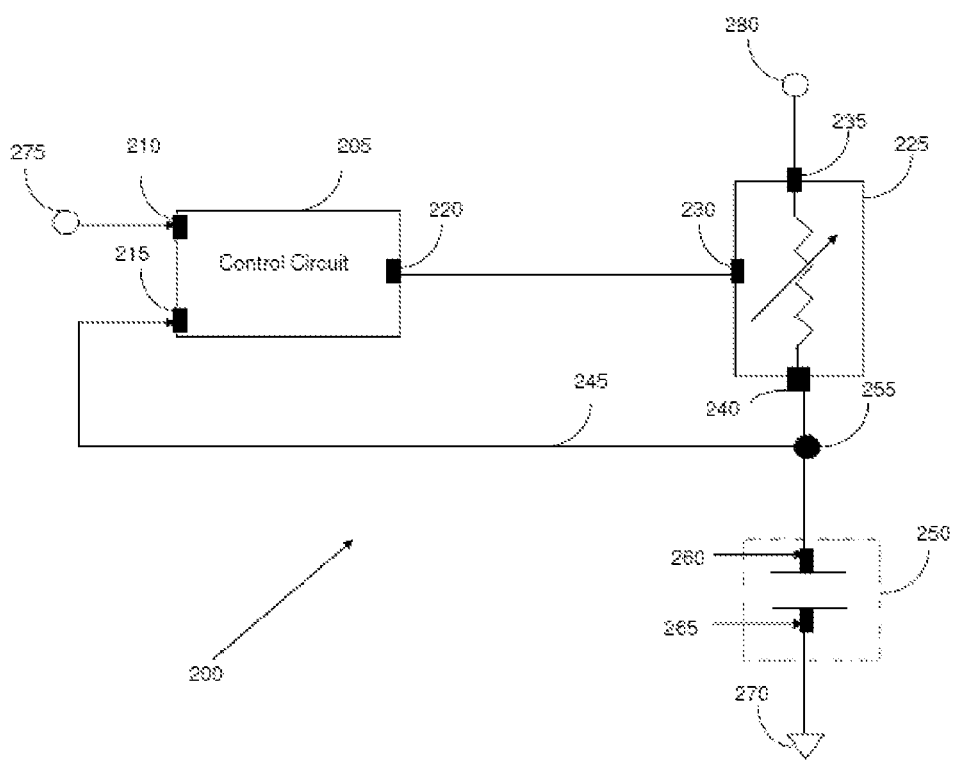

FIG. 1 is an exemplary illustration of a low-pass filter, in accordance with prior art; and FIG. 2 is an exemplary illustration of a filter circuit, in accordance with one embodiment.

DETAILED DESCRIPTION OF THE EMBODIMENTS

Often, for low noise applications, for example, radio frequency applications and power management systems, it is desired to have a very low cut-off frequency filter. In existing techniques, a low-pass filter can filter signals having low frequencies.

Referring to FIG. 1 now, a low-pass filter 100 in accordance with prior art includes a resistor 105 and a capacitor 110. The capacitor 110 is coupled to an electrical ground 115. An input signal Vin is received at node 120. The low-pass filter includes an output node 125 for providing an output signal Vo.

It is noted that transfer function (TF) of the low-pass filter 100 as a function of frequency is as shown in equation 1:

$$TF(f) = Vo(f)/Vin(f) \quad (1)$$

The cut-off frequency of the TF(f) is shown in equation 2:

$$F0 = 1/(2*pi*R*C) \quad (2)$$

Where pi=3.14, F0 is the cut-off frequency, R is resistance value of the resistor 105 and C is capacitance value of the capacitor 110.

In order to obtain very low cut-off frequency, the values of R and C should be very large based on the equation 2. However, a large value of R leads to large voltage drop (DC) between the node 120 and the node 125 owing to leakage current at the node 125. Further, leakage current of the capacitor 110 can cause a large voltage drop across the resistor 105, thereby making the low pas filter 100 unusable. Furthermore, a large resistance occupies a large area in an integrated circuit. Typically, capacitors having a large value of C are not realizable inside the integrated circuit. Hence, external capacitors are used to achieve large C value. However, this requires extra device pins and circuit board space.

An ultra low cut-off frequency filter that can be fabricated on the integrated circuit and that reduces noise due to leakage currents and prevents voltage error is explained in conjunction with FIG. 2.

Referring to FIG. 2 now, an ultra low cut-off frequency filter, hereinafter referred to as filter circuit 200 includes a control block 205. The control block 205, hereinafter referred to as the control circuit 205 includes a first input terminal 210, hereinafter referred to as terminal 210, a second input terminal 215, hereinafter referred to as terminal 215, and an output terminal 220, hereinafter referred to as terminal 220. The control circuit 205 is coupled to a controllable resistor 225. The controllable resistor 225 includes a first terminal 230, hereinafter referred to as terminal 230, a second terminal 235, hereinafter referred to as terminal 235, and a third terminal 240, hereinafter referred to as terminal 240. The filter circuit 200 includes a feedback path 245 that couples the control circuit 205 to the controllable resistor 225. The filter circuit 200 also includes a capacitor 250 that is coupled to the control circuit 205 and the controllable resistor 225 via node 255. The capacitor 250 includes a first terminal 260 and a second terminal 265. The first terminal 260, hereinafter referred to as terminal 260 is coupled to the node 255 and the second terminal 265, hereinafter referred to as terminal 265 is coupled to an electrical ground 270. In some embodiments the capacitor 250 can be coupled to a voltage source instead of the electrical ground 270.

In one embodiment, the control circuit 205 and the controllable resistor 225 is present inside the integrated circuit and the capacitor 250 is present outside the integrated circuit. In some embodiments, the control circuit 205, the controllable resistor 225, and the capacitor 250 can be present inside the integrated circuit.

The control circuit 205 can include a combination of metal oxide semiconductor transistors. In one embodiment, the control circuit 205 is a differential amplifier that amplifies the difference of input signals to output an amplified signal. In some embodiments, the control circuit 205 is a modulation circuit that modulates an input signal based on a feedback signal to output a modulated signal. In another embodiment, the control circuit 205 is a comparator operated in conjunction with a counter circuit.

The control circuit 205 is responsive to an input signal and a feedback signal to generate a control signal. In one embodiment, the control circuit 205 is an amplifier and operates as a negative feedback circuit. The terminal 210 is configured to receive the input signal. The input signal is received from a preceding circuit stage. In one embodiment, the input signal is received from a signal source 275. The terminal 215 is configured to receive a signal from the feedback path 245. The control circuit 205 generates the control signal at the terminal 220.

The controllable resistor 225 can be a metal oxide semiconductor transistor, for example, a p-type metal oxide semiconductor transistor (PMOS). The terminal 235 can be a source terminal, the terminal 230 can be a gate terminal, and the terminal 240 can be a drain terminal. The resistance of the controllable resistor 225 can be controlled by controlling signal at the terminal 230.

The controllable resistor 225 is responsive to a reference signal and the control signal to generate the feedback signal. The terminal 235 is configured to receive the reference signal. The reference signal is generated from a signal source, for example a source 280. The terminal 230 is configured to receive the control signal from the control circuit 205. The controllable resistor 225 is operable to remove noise from at least one of the input signal and the reference signal, to generate a signal at the terminal 240. It is noted that the signal at the terminal 240 can be referred to as the feedback signal. The feedback path 245 couples the signal from the terminal 240 to the terminal 215. The control circuit 205 is operable to control resistance of the controllable resistor 225.

By providing a negative feedback to the control circuit 205, it is ensured that voltage across the capacitor 250 is same as voltage of the input signal. Therefore, there is no DC voltage drop from source 275 to the node 255, thereby preventing voltage error in the filter circuit 200. If total current drawn out of the node 255 is I1, the control circuit 205 will control the signal at the terminal 230, such that resistance R of the controllable resistor 225 is given by equation 3:

$$R = In2 - In1/I1 \quad (3)$$

Where In2 is voltage of the reference signal at node 280 and In1 is the voltage of the input signal at node 275.

From equation 3, it is noted that the resistance of the controllable resistor 225 is directly proportional to voltage difference of the reference signal and the input signal and inversely proportional to a current at the node 255.

Replacing equation 3 in equation 2, the cut-off frequency of the filter circuit 200 is given by equation 4:

$$F0 = I1/(2*pi*(In2-In1)*C \quad (4)$$

Thus, the cut-off frequency of the filter circuit 200 depends on the current drawn from the node 255, the voltage difference between In2 and In1, and the capacitance value of the capacitor 250. The current I1 is small and is based on leakage current of the capacitor 250 and the control circuit 205. Therefore, a very low value of cut-off frequency can be obtained even with a low value of capacitance. Also, since the voltage at the node 255 is ensured to be same as In1 due to negative feedback through the control circuit 205, the voltage drop due to leakage currents is also minimized. The cut-off frequency is based on capacitor used and leakage current prevalent during fabrication process. In one example, for a 180 nanometer (nm) process, the cut-off frequency achievable is less than 1 hertz (Hz). In some embodiments, the filter circuit 200 is operable at cut-off frequencies in milli-hertz range. It is noted that the filter circuit 200 is also operable at cut-off frequencies greater than 1 Hz.

Various embodiments of the filter circuit 200 can be used for low-pass frequency filtering operation. Further, the filter circuit 200 can be used for low-pass noise filtering operation. The filter circuit 200 is area efficient and reduces external pin requirements on a circuit board. The filter circuit 200 can also be used in one of a peak detector and a crest detector if the input signal is time-varying.

In the foregoing discussion, the term "coupled or connected" refers to either a direct electrical connection or mechanical connection between the devices connected or an indirect connection through intermediary devices.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A filter circuit having a selectively set cut-off frequency comprising:
   a capacitor device;
   a control circuit responsive to an input signal and a feedback signal to generate a control signal;
   a controllable resistor coupled to the control circuit, and the capacitor device, the controllable resistor being responsive to a reference signal and the control signal to generate the feedback signal, a resistance of the controllable resistor being proportional to a voltage difference of the reference signal and the input signal wherein the resistance of the controllable resistor is inversely proportional to a current at output of the controllable resistor; and
   a feedback path coupled to the control circuit and the controllable resistor to couple the feedback signal from the controllable resistor to the control circuit, the control circuit controlling the controllable resistor to adaptively minimize leakage voltage drop thereacross by modulating resistance thereof, thereby preventing noise from at least one of the input signal and the reference signal from appearing at an output of the filter circuit, and preventing voltage error at the output of the filter circuit.

2. The filter circuit as claimed in claim 1, wherein the control circuit is operable to control resistance of the controllable resistor.

3. The filter circuit as claimed in claim 2, wherein the resistance of the controllable resistor is directly proportional to difference in voltage of the reference signal and the input signal.

4. The filter circuit as claimed in claim 1, wherein the controllable resistor comprises a metal oxide semiconductor transistor.

5. The filter circuit as claimed in claim 1 wherein the capacitor is coupled to the controllable resistor and the feedback path to filter one or more frequencies.

6. A filter circuit having a selectively set cut-off frequency comprising:
   a control circuit having a first input terminal, a second input terminal, and an output terminal, the first input terminal configured to receive an input signal from an input source, the second input terminal configured to receive a feedback signal, the control circuit operable to generate a control signal at the output terminal;
   a controllable resistor coupled to the control circuit and having a first terminal, a second terminal, and a third terminal, the first terminal configured to receive a reference signal from a reference source, the second terminal configured to receive the control signal from the control circuit, to generate the feedback signal, a resistance of the controllable resistor being proportional to a voltage difference of the reference signal and the input signal wherein the resistance of the controllable resistor is inversely proportional to a current at output of the controllable resistor;
   a feedback path coupled to the control circuit and the controllable resistor to couple the feedback signal from the controllable resistor to the control circuit, the control circuit controlling the controllable resistor to adaptively minimize leakage voltage drop thereacross by modulating the resistance thereof, thereby preventing noise from at least one of the input signal and the reference signal from appearing at an output of the filter circuit, and preventing voltage error at the output of the filter circuit; and
   a capacitor device having a first terminal and a second terminal, the first terminal of the capacitor coupled to the third terminal of the controllable resistor and the second terminal of the capacitor coupled to one of an electrical ground and a voltage source, to filter one or more frequencies.

7. The filter circuit as claimed in claim 6, wherein the control circuit is operable to control resistance of the controllable resistor.

8. The filter circuit as claimed in claim 7, wherein the resistance of the controllable resistor is directly proportional to voltage difference of the reference signal and the input signal.

9. The filter circuit as claimed in claim 6, wherein the filter circuit is selectively configured for low-pass frequency filtering operation.

10. The filter circuit as claimed in claim 6, wherein the filter circuit is disposed in an integrated circuit.

11. The filter circuit as claimed in claim 6, wherein the controllable resistor comprises a metal oxide semiconductor transistor.

\* \* \* \* \*